United States Patent
Lee (10) Patent No.: US 9,040,976 B2
(45) Date of Patent: May 26, 2015

(54) ORGANIC LIGHT EMITTING DISPLAY PANEL AND ORGANIC LIGHT EMITTING DISPLAY DEVICE HAVING THE SAME

(71) Applicant: Samsung Display Co., Ltd., Yongin, Gyeonggi-Do (KR)

(72) Inventor: Myoung-Gu Lee, Yongin-si (KR)

(73) Assignee: SAMSUNG DISPLAY CO., LTD. (KR)

(*) Notice: Subject to any disclaimer, the term of this patent is extended or adjusted under 35 U.S.C. 154(b) by 0 days.

(21) Appl. No.: 14/322,356

(22) Filed: Jul. 2, 2014

(65) Prior Publication Data

US 2015/0014660 A1    Jan. 15, 2015

(30) Foreign Application Priority Data

Jul. 15, 2013 (KR) .................. 10-2013-0082867

(51) Int. Cl.
| | |
|---|---|
| H01L 51/52 | (2006.01) |
| H01L 27/15 | (2006.01) |
| G09G 3/30 | (2006.01) |
| H01L 27/32 | (2006.01) |

(52) U.S. Cl.
CPC ............ H01L 51/5268 (2013.01); H01L 27/32 (2013.01); H01L 51/5275 (2013.01)

(58) Field of Classification Search
CPC .. H01L 51/5268; H01L 51/5275; H01L 27/32
USPC ............ 257/40, 88, E51.018, E33.073; 361/602, 615; 359/463; 345/76; 313/110, 112
See application file for complete search history.

(56) References Cited

U.S. PATENT DOCUMENTS

| | | | |
|---|---|---|---|
| 8,408,775 B1* | 4/2013 | Coleman ...................... 362/615 |
| 2008/0094700 A1* | 4/2008 | Uehara .......................... 359/463 |
| 2012/0205675 A1* | 8/2012 | Yamazaki et al. .............. 257/88 |
| 2012/0218173 A1* | 8/2012 | Ohta et al. ...................... 345/76 |
| 2012/0241771 A1 | 9/2012 | Kato et al. | |
| 2012/0286286 A1 | 11/2012 | Jung et al. | |
| 2014/0264310 A1* | 9/2014 | Hamatani et al. ............... 257/40 |

FOREIGN PATENT DOCUMENTS

| | | |
|---|---|---|
| KR | 1020070098314 A | 10/2007 |
| KR | 1020120108906 A | 10/2012 |
| KR | 1020120126981 A | 11/2012 |

* cited by examiner

Primary Examiner — Dao H Nguyen
(74) Attorney, Agent, or Firm — Cantor Colburn LLP (57) ABSTRACT

An organic light emitting display panel includes a substrate, an organic light emitting diode disposed on a first side of the substrate, and a first light scattering layer disposed on a second side of the substrate opposite to the first side of the substrate, where the first light scattering layer includes a transparent thin layer including an indium, and a plurality of first micro-lenses is disposed on a plasma-treated side of the first light scattering layer.

20 Claims, 5 Drawing Sheets

ORGANIC LIGHT EMITTING DISPLAY PANEL AND ORGANIC LIGHT EMITTING DISPLAY DEVICE HAVING THE SAME

This application claims priority to Korean Patent Application No. 10-2013-0082687, filed on Jul. 15, 2013, and all the benefits accruing therefrom under 35 U.S.C. §119, the contents of which are incorporated herein in its entirety by reference.

BACKGROUND

1. Field

Exemplary embodiments of the invention generally relate to a display device. More particularly, exemplary embodiments of the invention relate to an organic light emitting display panel and an organic light emitting display device having the same.

2. Description of the Related Art

An organic light emitting display device displays information of images or characters by using light generated when holes and electrons, which are provided from an anode and a cathode, respectively, are combined with each other at an organic light emitting layer interposed between the anode and the cathode. The organic light emitting display device has been spotlighted as a next-generation display device because the organic light emitting display device has various advantages such as a wide viewing angle, a rapid response speed, a thin thickness, low power consumption, etc.

Generally, light efficiency of the organic light emitting display device is limited to about 20 percent (%) because light loss occurs at a boundary of layers due to difference (i.e., mismatching) of refractive index. Recently, various methods for increasing the light efficiency have been suggested. A surface of an organic light emitting diode ("OLED") may be made non-uniform or rugged, or may be treated to have texturing patterns, for example.

SUMMARY

Various methods suggested for increasing a light efficiency may increase manufacturing costs due to expensive equipment, complex processes, etc. In addition, a light scattering layer formed by a photolithography process may have problems related to durability and adhesion with substrate.

Exemplary embodiments provide an organic light emitting display panel having improved light efficiency.

Exemplary embodiments provide an organic light emitting display device having the organic light emitting display panel.

According to exemplary embodiments, an organic light emitting display panel may include a substrate, an organic light emitting diode ("OLED") disposed on a first side of the substrate, and a first light scattering layer disposed on a second side of the substrate opposite to the first side of the substrate. Here, the first light scattering layer may include a transparent thin layer including an indium, and a plurality of first micro-lenses may be disposed on a plasma-treated side of the first light scattering layer.

In exemplary embodiments, the first light scattering layer may further include Indium Tin Oxide ("ITO") or Indium Zinc Oxide ("IZO").

In exemplary embodiments, the plurality of first micro-lenses may be regularly arranged on the first light scattering layer.

In exemplary embodiments, the plurality of first micro-lenses may be irregularly arranged on the first light scattering layer.

In exemplary embodiments, each of the plurality of first micro-lenses may have a polygon-shape.

In exemplary embodiments, each of the plurality of first micro-lenses may have a circle-shape.

In exemplary embodiments, a diameter of each of the plurality of first micro-lenses may range from about 5 micrometers (μm) to about 10 μm.

In exemplary embodiments, the organic light emitting display panel may have a top emission type structure, a bottom emission type structure, or a both-sides emission type structure.

In exemplary embodiments, the organic light emitting display panel may further include a second light scattering layer disposed between the substrate and the organic light emitting diode.

In exemplary embodiments, the second light scattering layer may include a transparent thin layer including the indium, and a plurality of second micro-lenses may be disposed on the second light scattering layer by the plasma treatment process.

In exemplary embodiments, the organic light emitting display panel may further include a planarization layer disposed between the substrate and the second light scattering layer.

According to exemplary embodiments, an organic light emitting display device may include an organic light emitting display panel having a plurality of pixel circuits, a scan driving unit configured to provide a scan signal to the pixel circuits, a data driving unit configured to provide a data signal to the pixel circuits, and a timing control unit configured to control the scan driving unit and the data driving unit. Here, the organic light emitting display panel may have a substrate, an OLED disposed on a first side of the substrate, and a first light scattering layer disposed on a second side of the substrate. Here, the first light scattering layer may be a transparent thin layer including an indium, and a plurality of first micro-lenses may be disposed on the first light scattering layer by a plasma treatment process.

In exemplary embodiments, the first light scattering layer may include ITO or IZO.

In exemplary embodiments, the plurality of first micro-lenses may be irregularly arranged on the first light scattering layer.

In exemplary embodiments, the plurality of first micro-lenses may have a circle-shape In exemplary embodiments, a diameter of each of the plurality of first micro-lenses may range from about 5 μm to about 10 μm.

In exemplary embodiments, the display panel may have a top emission type structure, bottom emission type structure, or both-sides emission type structure.

In exemplary embodiments, the organic light emitting display panel may further include a second light scattering layer disposed between the substrate and the organic light emitting diode.

In exemplary embodiments, the second light scattering layer may include a transparent thin layer including an indium, and a plurality of second micro-lenses may be disposed on a plasma-treated side of the second light scattering layer.

In exemplary embodiments, the organic light emitting display panel may further include a planarization layer disposed between the substrate and the second light scattering layer.

Therefore, an organic light emitting display panel according to exemplary embodiments may increase light efficiency without additional equipment by disposing a plurality of micro-lenses on the plasma-treated side of a first light scattering layer.

In addition, an organic light emitting display device having the organic light emitting display panel according to exemplary embodiments may display high-quality images.

BRIEF DESCRIPTION OF THE DRAWINGS

Illustrative, non-limiting exemplary embodiments, advantages and features of this disclosure will be more clearly understood from the following detailed description taken in conjunction with the accompanying drawings, in which.

DETAILED DESCRIPTION

Various exemplary embodiments will be described more fully hereinafter with reference to the accompanying drawings, in which exemplary embodiments are shown. The invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular exemplary embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Unless otherwise defined, all terms (including technical and scientific terms) used herein have the same meaning as commonly understood by one of ordinary skill in the art to which the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
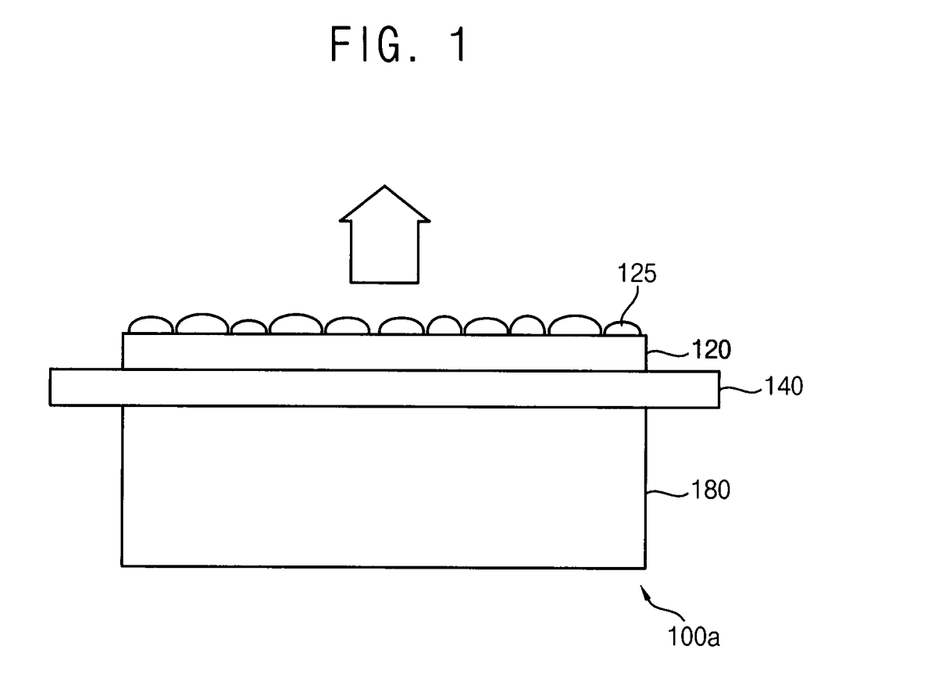
FIG. 1 is a cross-sectional view illustrating an organic light emitting display panel according to exemplary embodiments.

FIG. 1 is a cross-sectional view illustrating an organic light emitting display panel according to exemplary embodiments.

Referring to FIG. 1, the organic light emitting display panel 100a may include a first light scattering layer 120, a substrate 140, and an organic light emitting diode ("OLED") 180.

The substrate 140 may include a base substrate when the organic light emitting display panel 100a has a bottom emission type structure, and the substrate 140 may include a glass substrate including Silicon dioxide (SiO2), a plastic substrate, or a substrate using other materials. The substrate 140 may include an encapsulation substrate when the organic light emitting display panel 100a has a top emission type structure, and the substrate 140 may include a glass substrate or a plastic substrate including transparent materials. The substrate 140 may also include a base substrate or an encapsulation substrate when the organic light emitting display panel 100a has a both-sides emission type structure.

The first light scattering layer 120 may be disposed on a second side of the substrate 140 opposite to a first side of the substrate 140. The first light scattering layer 120 may include a transparent thin layer including an indium, and a plurality of first micro-lenses 125 may be disposed on the first light scattering layer 120 such as by a plasma treatment process. In one exemplary embodiment, the first light scattering layer 120 may include Indium Tin Oxide ("ITO") or Indium Zinc Oxide ("IZO").

In one exemplary embodiment, the first micro-lenses 125 may be disposed on the first light scattering layer 120 by a plasma treatment process. The first micro-lenses 125 may increase amount of emission light by scattering the light generated from the OLED 180. The first micro-lenses 125 may decrease the number of TIR in the organic light emitting display panel 100a, and may increase light efficiency of the organic light emitting display panel 100a about 1.5 times.

The OLED 180 may be disposed on the first side of the substrate 140. The OLED 180 may include an anode, a cathode and various organic layers such as an organic light emitting layer, a hole injection layer, an electron transfer layer, etc. between the anode and the cathode. In one exemplary embodiment, the organic light emitting display panel 100a may have the top emission type structure, the bottom emission type structure, or the both-sides emission type structure. Generally, the organic light emitting display panel 100a having the top emission type structure may have high light efficiency than the organic light emitting display panel 100a having bottom emission type structure. Specially, when the organic light emitting display panel 100a having the top emission type structure includes the first micro-lenses 125, the organic light emitting display panel 100a may effectively prevent a blurring problem that results in difficulties in distinguishing pixels.

Figure 2:
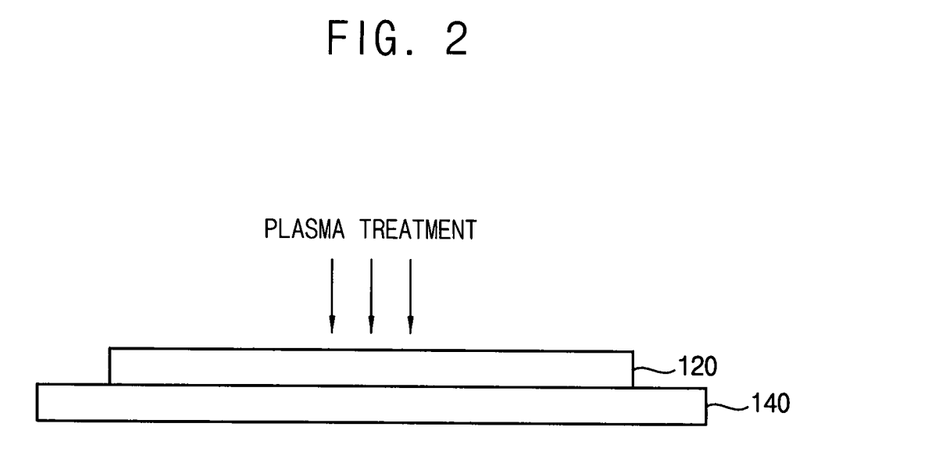
FIG. 2 is a cross-sectional view illustrating an exemplary embodiment of a first light scattering layer before a plurality of first micro-lenses is provided in an organic light emitting display panel of FIG. 1.

FIG. 2 is a cross-sectional view illustrating an exemplary embodiment of a first light scattering layer 120 before a plurality of first micro-lenses is disposed in an organic light emitting display panel 100a of FIG. 1.

Referring to FIG. 2, the first light scattering layer 120 may be disposed on the substrate 140, and a surface of the first light scattering layer 120 may be modified by a plasma treatment.

The substrate 140 may include a glass substrate or a plastic substrate. The substrate 140 may include an encapsulation substrate when the organic light emitting display panel has a top emission type structure. The substrate 140 may include an encapsulation substrate when the organic light emitting display panel has a top emission type structure.

The first light scattering layer 120 may be disposed on a second side of the substrate 140 opposite to a first side of the substrate 140 on which an OLED 180 is disposed. The first light scattering layer 120 may include a transparent thin layer including an indium such as ITO. The first light scattering layer 120 on which the first micro-lenses is provided by a plasma treatment process can increase light efficiency of the organic light emitting display panel.

Since the substrate 140 and the first light scattering layer 120 are described above, duplicated descriptions will be omitted.

Figure 3:
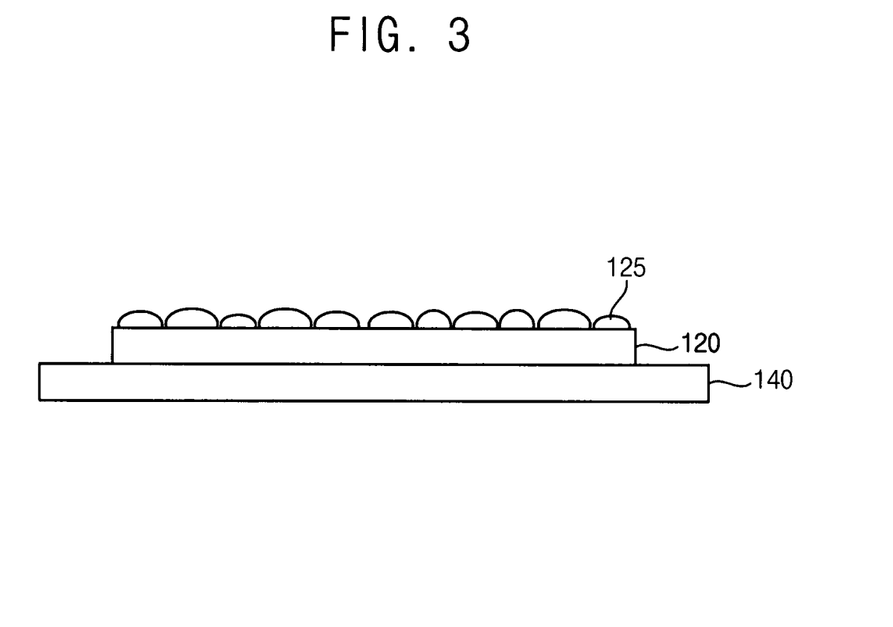
FIG. 3 is a cross-sectional view illustrating an exemplary embodiment of a first light scattering layer after a plurality of first micro-lenses are provided in an organic light emitting display panel of FIG. 1.

FIG. 3 is a cross-sectional view illustrating an exemplary embodiment of a first light scattering layer 120 after a plurality of first micro-lenses 125 is provided in an organic light emitting display panel 100a of FIG. 1.

Referring to FIG. 3, a plurality of first micro-lenses 125 may be disposed on the first light scattering layer 120 by a plasma treatment process. In one exemplary embodiment, the plasma treatment process may use hydrogen. In an exemplary embodiment, an Indium Oxide ($In_2O_3$) which is principal constituent of the first light scattering layer 120 may react with hydrogen plasma, and the Indium Oxide may be deoxidized, for example. Therefore, when a surface of the first light scattering layer 120 is modified by the plasma treatment process using hydrogen, the first micro-lenses 125 are disposed on the first light scattering layer 120. A size and a density of the first micro-lenses 125 may be determined by adjusting intensity of the hydrogen plasma. The plasma treatment process can use other plasma material to deoxidize Indium Oxide for providing the first micro-lenses 125.

Light efficiency of the organic light emitting display panel 100a may be relatively low because of total internal reflection ("TIR"). The first micro-lenses 125 may increase amount of emission light by scattering a light generated from an OLED 180. The first micro-lenses 125 may adjust incidence angle of light for decreasing a number of TIR. The first micro-lenses 125 may increase light efficiency of the organic light emitting display panel 100a about 1.5 times, and may decrease power consumption of the organic light emitting display panel. In one exemplary embodiment, the first micro-lenses 125 may be regularly arranged on the first light scattering layer 120. In another exemplary embodiment, the first micro-lenses 125 may be irregularly arranged on the first light scattering layer 120. In one exemplary embodiment, each of the first micro-lenses 125 may have a polygon-shape. In another exemplary embodiment, each of the first micro-lenses 125 may have a circle-shape.

Figure 4:
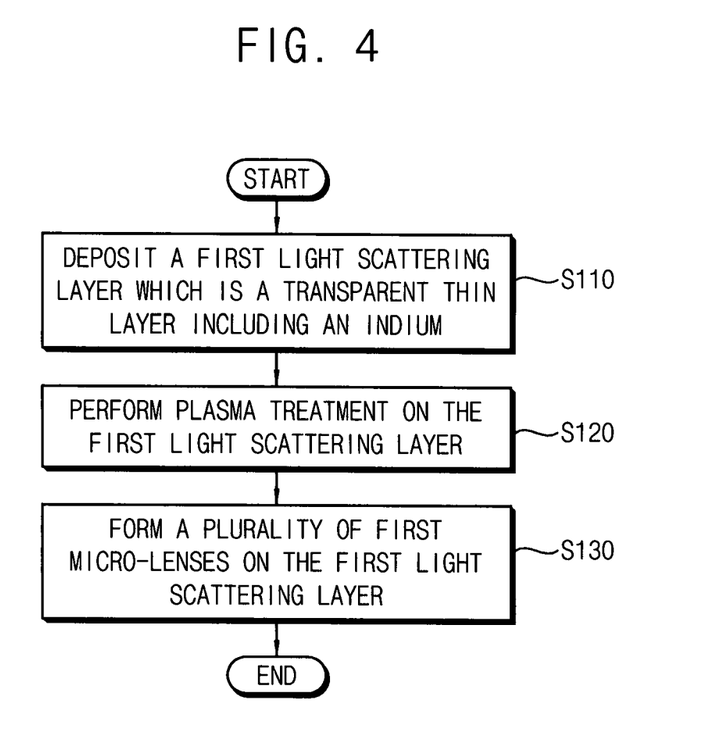
FIG. 4 is a flow chart illustrating a process of providing a first light scattering layer in an organic light emitting display panel of FIG. 1.

FIG. 4 is a flow chart illustrating a process of providing a first light scattering layer 120 in an organic light emitting display panel 100a of FIG. 1.

Referring to FIG. 4, the process of FIG. 4 may include an operation of depositing a first light scattering layer 120 which includes a transparent thin layer including an indium (S110), an operation of performing plasma treatment on the first light scattering layer 120 (S120), and an operation of disposing a plurality of first micro-lenses 125 on the first light scattering layer 120 (S130).

Specifically, the first light scattering layer 120 may be deposited on a second side of the substrate 140 opposite to a first side of the substrate 140 on which an OLED 180 is disposed (S110). The substrate 140 may include a base substrate when the organic light emitting display panel 100a has a bottom emission type structure, or may include an encapsulation substrate when the organic light emitting display panel 100a has a top emission type structure. The first light scattering layer 120 may be treated by plasma treatment process (S120), and the first micro-lenses 125 may be disposed on the first light scattering layer 120 (S130).

In exemplary embodiments, the method of FIG. 4 may further include an operation of depositing a second light scattering layer which includes a transparent thin layer including an indium, an operation of performing plasma treatment on the second light scattering layer, an operation of disposing a plurality of second micro-lenses on the second light scattering layer, and an operation of depositing a planarization layer between the substrate and the second light scattering layer.

In exemplary embodiments, the first light scattering layer may be disposed on a cover glass. The first light scattering layer may be disposed on the cover glass for protecting the organic light emitting display panel 100a, and then the cover glass and the organic light emitting display panel 100a may be combined for increasing light efficiency of the organic light emitting display panel 100a.

Figure 5:
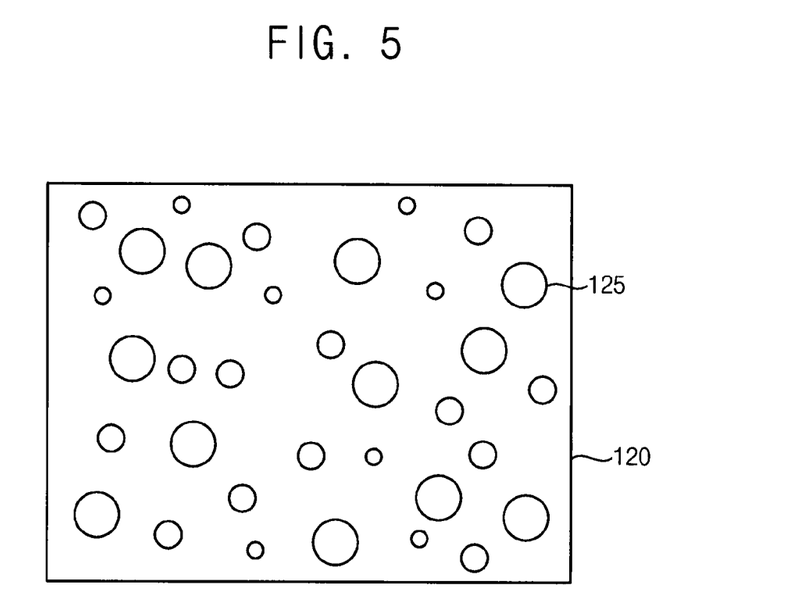
FIG. 5 is a plan view illustrating an exemplary embodiment in which a plurality of first micro-lenses are irregularly arranged on a first light scattering layer in an organic light emitting display panel of FIG. 1.

FIG. 5 is a plan view illustrating an exemplary embodiment in which a plurality of first micro-lenses 125 is irregularly arranged on a first light scattering layer 120 in an organic light emitting display panel 100a of FIG. 1.

Referring to FIG. 5, a plurality of first micro-lenses 125 may be irregularly arranged on a first light scattering layer 120 by plasma treatment process. The organic light emitting display panel 100a including the first micro-lenses 125 that are irregularly arranged (i.e., non-arrayed micro-lens) may have high light efficiency for a wide view angle without any change in color.

In exemplary embodiments, a diameter of each of the first micro-lenses 125 may range from about 5 micrometers (μm) to about 10 μm. In addition, a size and a density of the first micro-lenses 125 may be determined by adjusting intensity of the plasma treatment. A light spectrum may be changed in the organic light emitting display panel 100a having the first micro-lenses 125. Therefore, a diameter of respective first micro-lenses 125 may be less than or equal to 10 μm. In addition, a diameter of respective first micro-lenses 125 may be larger than wavelength of light for reducing an influence on the wavelength of light in visible light zone.

Figure 6:
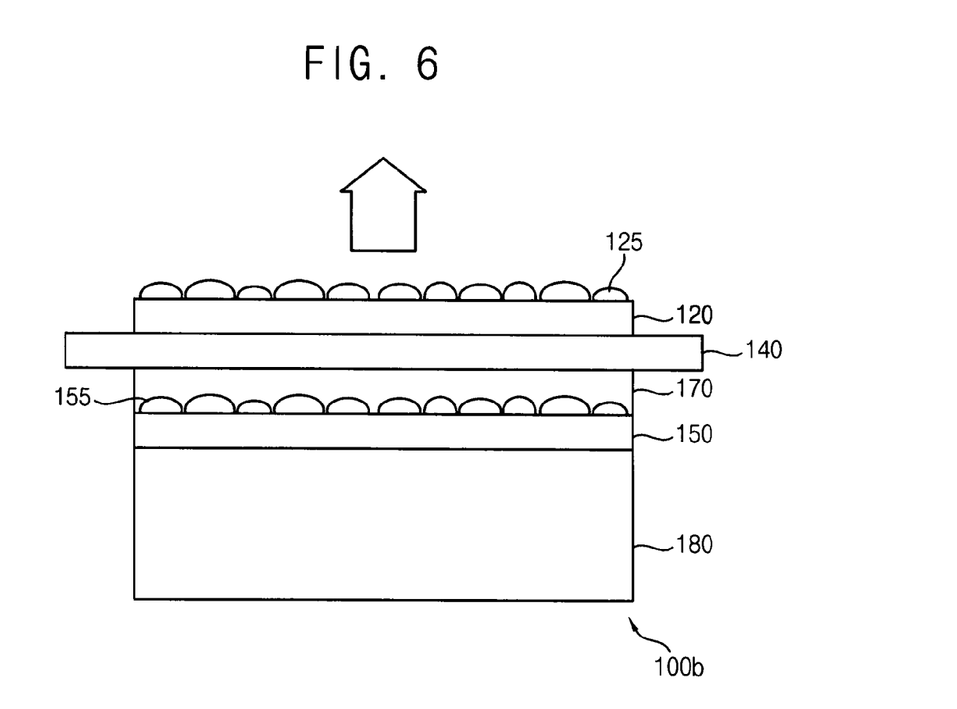
FIG. 6 is a cross-sectional view illustrating an organic light emitting display panel according to exemplary embodiments.

FIG. 6 is a cross-sectional view illustrating an organic light emitting display panel according to another exemplary embodiments.

Referring to FIG. 6, the organic light emitting display panel 100b may include a first light scattering layer 120, a substrate 140, an OLED 180, a second light scattering layer 150, and a planarization layer 170.

The second light scattering layer 150 may be disposed between the substrate 140 and the OLED 180. The second light scattering layer 150 may scatter the light between the substrate 140 and the OLED 180 such that the organic light emitting display panel 100b may have high light efficiency. In one exemplary embodiment, like the first light scattering layer 120, the second light scattering layer 150 may include a transparent thin layer including an indium. A plurality of second micro-lenses 155 may be disposed on the second light scattering layer 150 by a plasma treatment process. In an exemplary embodiment, the second light scattering layer 150 may include ITO or IZO. In exemplary embodiments, the second light scattering layer 150 may be disposed inside the OLED 180. In an exemplary embodiment, an anode or a cathode may be a transparent thin layer including an indium, and a plurality of micro-lenses may be disposed on the anode or the cathode by a plasma treatment process. The anode or the cathode may scatter the light for increasing (i.e., improving) light efficiency. In exemplary embodiments, the organic light emitting display panel 100b may further include additional light scattering layers for increasing light efficiency.

The planarization layer 170 may be disposed on the second light scattering layer 150 for providing a flat surface. In an exemplary embodiment, the planarization layer 170 may include an insulation material such as silicon oxide.

Figure 7:
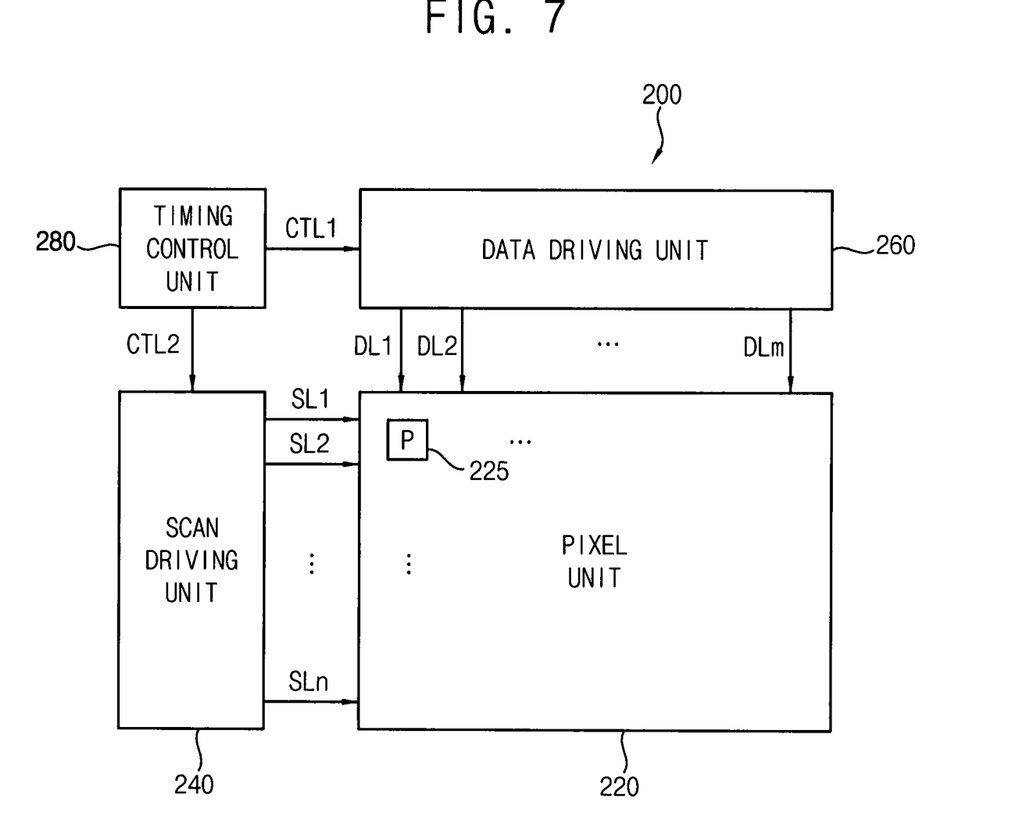
FIG. 7 is a block diagram illustrating an organic light emitting display device according to exemplary embodiments.

FIG. 7 is a block diagram illustrating an organic light emitting display device according to exemplary embodiments.

Referring to FIG. 7, the organic light emitting display device 200 may include an organic light emitting display panel 220, a scan driving unit 240, a data driving unit 260 and a timing control unit 280. In one exemplary embodiment, the scan driving unit 240, the data driving unit 260, and the timing control unit 280 may be included in one integrated circuit. In another exemplary embodiment, the scan driving unit 240, the data driving unit 260 and the timing control unit 280 may be included in different integrated circuits.

The organic light emitting display panel 220 may include a pixel unit including pixel circuits 225. The organic light emitting display panel 220 may be coupled to the scan driving unit 240 via scan-lines SL1 through SLn, and may be coupled to the data driving unit 260 via data-lines DL1 through DLm. Here, the organic light emitting display panel 220 may include n by m (where n and m are natural numbers) pixel circuits 225 because the pixel circuits 225 are arranged at locations corresponding to crossing points of the scan-lines SL1 through SLn and the data-lines DL1 through DLm.

The organic light emitting display panel 220 may correspond to the organic light emitting display panel 100a of FIG. 1, or the organic light emitting display panel 100b of FIG. 6. The organic light emitting display panel 220 may include a substrate, an OLED disposed on a first side of the substrate, and a first light scattering layer disposed on a second side of the substrate. Here, the first light scattering layer may include a transparent thin layer including an indium, and a plurality of first micro-lenses may be disposed on the first light scattering layer by a plasma treatment process.

In one exemplary embodiment, the first light scattering layer may include ITO or IZO. In one exemplary embodiment, the first micro-lenses may be irregularly arranged on the first light scattering layer. In one exemplary embodiment, the first micro-lenses may have a circle-shape. In one exemplary embodiment, a diameter of each of the first micro-lenses may range from about 5 μm to about 10 μm. In one exemplary embodiment, the display panel 220 may have a top emission type structure, a bottom emission type structure, or a both-sides emission type structure. In one exemplary embodiment, the organic light emitting display panel 220 may further include a second light scattering layer disposed between the substrate and the OLED. In one exemplary embodiment, the organic light emitting display panel 220 may further include a planarization layer disposed between the substrate and the second light scattering layer. The organic light emitting display panel 220 may have improved light efficiency. Since the organic light emitting display panel 220 is described above, duplicated descriptions will be omitted.

The scan driving unit 240 may provide a scan signal to the pixel circuits 225 via the scan-lines SL1 through SLn. The data driving unit 260 may provide a data signal to the pixel circuits 225 via the data-lines DL1 through DLm. The timing control unit 280 may control the data driving unit 260 and the scan driving unit 240, based on control signals CTL1 and CTL2, respectively.

Figure 8:
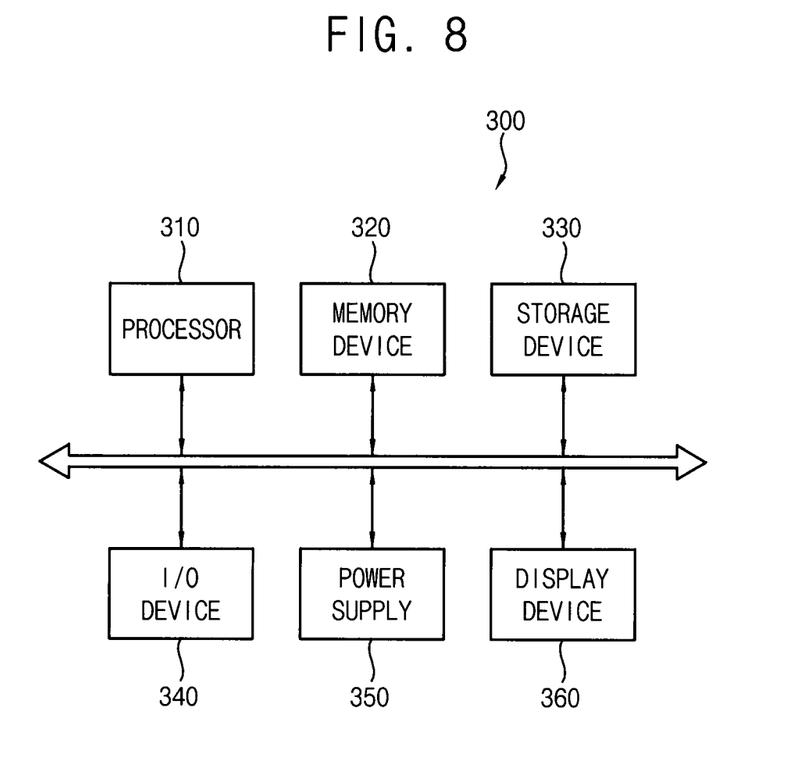
FIG. 8 is a block diagram illustrating an exemplary embodiment of an electronic device having an organic light emitting display device of FIG. 7.

FIG. 8 is a block diagram illustrating an exemplary embodiment of an electronic device having an organic light emitting display device 200 of FIG. 7.

Referring to FIG. 8, an electronic device 300 may include a processor 310, a memory device 320, a storage device 330, an input/output ("I/O") device 340, a power supply 350, and an organic light emitting display device 360. Here, the electronic device 300 may further include a plurality of ports for communicating various types of other electronic devices such as a video card, a sound card, a memory card, a universal serial bus ("USB") device, etc.

The processor 310 may perform various computing functions. The processor 310 may include a microprocessor, a central processing unit ("CPU"), etc. The processor 310 may be coupled to other components via an address bus, a control bus, a data bus, etc. Further, the processor 310 may be coupled to an extended bus such as a peripheral component interconnection ("PCI") bus.

The memory device 320 may store data for operations of the electronic device 300. In an exemplary embodiment, the memory device 320 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferro electric random access memory ("FRAM") device, etc, and/or at least one volatile memory device such as a dynamic random access memory ("DRAM") device, a static random access memory ("SRAM") device, a mobile DRAM device, etc.

The storage device 330 may be a solid state drive ("SSD") device, a hard disk drive ("HDD") device, a CD-ROM device, etc. The I/O device 340 may be an input device such as a keyboard, a keypad, a touchpad, a touch-screen, a mouse, etc, and an output device such as a printer, a speaker, etc. The power supply 350 may provide a power for operations of the electronic device 300. The organic light emitting display device 360 may communicate with other components via the buses or other communication links.

The organic light emitting display device 360 may correspond to the organic light emitting display device of FIG. 7 that may include an organic light emitting display panels 100a or 100b of FIGS. 1 and 6. Therefore, the organic light emitting display device 360 having the organic light emitting display panel may display high-quality images.

The invention may be applied to an electronic device having an organic light emitting display device. In an exemplary embodiment, the invention may be applied to various types electronic devices such as a television, a computer monitor, a laptop, a digital camera, a cellular phone, a smart phone, a smart pad, a personal digital assistant ("PDA"), a portable multimedia player ("PMP"), a MP3 player, a navigation system, a game console, a video phone, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An organic light emitting display panel comprising:
   a substrate;
   an organic light emitting diode disposed on a first side of the substrate;
   a first light scattering layer disposed on a second side of the substrate opposite to the first side of the substrate; and
   a plurality of first micro-lenses disposed on the first light scattering layer,
   wherein
   the first light scattering layer includes a transparent thin layer including indium, and
   the plurality of first micro-lenses is disposed on a plasma-treated side of the first light scattering layer.

2. The organic light emitting display panel of claim 1, wherein the first light scattering layer further includes Indium Tin Oxide or Indium Zinc Oxide.

3. The organic light emitting display panel of claim 1, wherein the plurality of first micro-lenses is regularly arranged on the first light scattering layer.

4. The organic light emitting display panel of claim 1, wherein the plurality of first micro-lenses is irregularly arranged on the first light scattering layer.

5. The organic light emitting display panel of claim 1, wherein each of the plurality of first micro-lenses has a polygon-shape.

6. The organic light emitting display panel of claim 1, wherein each of the plurality of first micro-lenses has a circle-shape.

7. The organic light emitting display panel of claim 6, wherein a diameter of each of the plurality of first micro-lenses ranges from about 5 micrometers to about 10 micrometers.

8. The organic light emitting display panel of claim 1, wherein the organic light emitting display panel has a top emission type structure, a bottom emission type structure, or a both-sides emission type structure.

9. The organic light emitting display panel of claim 1, further comprising:
   a second light scattering layer disposed between the substrate and the organic light emitting diode.

10. The organic light emitting display panel of claim 9, further comprising a plurality of second micro-lenses disposed on the second light scattering layer,
    wherein
    the second light scattering layer includes a transparent thin layer including the indium, and
    the plurality of second micro-lenses is disposed on a plasma-treated side of the second light scattering layer.

11. The organic light emitting display panel of claim 9, further comprising:
    a planarization layer disposed between the substrate and the second light scattering layer.

12. An organic light emitting display device comprising:
    an organic light emitting display panel including a plurality of pixel circuits;
    a scan driving unit configured to provide a scan signal to the plurality of pixel circuits;
    a data driving unit configured to provide a data signal to the plurality of pixel circuits; and
    a timing control unit configured to control the scan driving unit and the data driving unit,
    wherein the organic light emitting display panel includes:
      a substrate;

an organic light emitting diode disposed on a first side of the substrate; and a first light scattering layer disposed on a second side of the substrate opposite to the first side of the substrate; and a plurality of first micro-lenses disposed on the first light scattering layer, wherein the first light scattering layer includes a transparent thin layer including indium, and the plurality of first micro-lenses is disposed on a plasma treated side of the first light scattering layer.

13. The organic light emitting display device of claim 12, wherein the first light scattering layer further includes Indium Tin Oxide or Indium Zinc Oxide.

14. The organic light emitting display device of claim 12, wherein the plurality of first micro-lenses is irregularly arranged on the first light scattering layer.

15. The organic light emitting display device of claim 12, wherein the plurality of first micro-lenses has a circle-shape.

16. The organic light emitting display device of claim 15, wherein a diameter of each of the plurality of first micro-lenses ranges from about 5 micrometers to about 10 micrometers.

17. The organic light emitting display device of claim 12, wherein the display panel has a top emission type structure, bottom emission type structure, or both-sides emission type structure.

18. The organic light emitting display device of claim 12, wherein the organic light emitting display panel further includes:

a second light scattering layer disposed between the substrate and the organic light emitting diode.

19. The organic light emitting display device of claim 18, further comprising a plurality of second micro-lenses disposed on the second light scattering layer, wherein the second light scattering layer includes a transparent thin layer including indium, and the plurality of second micro-lenses is disposed on a plasma treated side of the second light scattering layer.

20. The organic light emitting display device of claim 18, wherein the organic light emitting display panel further includes:

a planarization layer disposed between the substrate and the second light scattering layer.

* * * * *